United States Patent
Kobiki

(10) Patent No.: US 8,459,928 B2
(45) Date of Patent: Jun. 11, 2013

(54) CONVEYOR ROBOT

(75) Inventor: Takahiro Kobiki, Ibara (JP)

(73) Assignee: Tazmo Co., Ltd., Okayama (JP)

( * ) Notice: Subject to any disclaimer, the term of this patent is extended or adjusted under 35 U.S.C. 154(b) by 450 days.

(21) Appl. No.: 12/866,910

(22) PCT Filed: Feb. 20, 2009

(86) PCT No.: PCT/JP2009/052963
§ 371 (c)(1),
(2), (4) Date: Aug. 10, 2010

(87) PCT Pub. No.: WO2009/107550
PCT Pub. Date: Sep. 3, 2009

(65) Prior Publication Data
US 2010/0322745 A1    Dec. 23, 2010

(30) Foreign Application Priority Data
Feb. 27, 2008 (JP) .................................. 2008-046337

(51) Int. Cl.
*B25J 15/00* (2006.01)
*B25J 21/00* (2006.01)
*B66C 23/00* (2006.01)
*B65G 35/00* (2006.01)

(52) U.S. Cl.
USPC ............ 414/744.5; 414/941; 901/15; 901/31; 74/490.05

(58) Field of Classification Search
USPC ............... 414/744.5, 941; 74/490.05; 901/15, 901/31
See application file for complete search history.

(56) References Cited

U.S. PATENT DOCUMENTS

| | | | | |
|---|---|---|---|---|
| 5,810,935 | A | * | 9/1998 | Lee et al. ....................... 118/728 |
| 6,155,768 | A | * | 12/2000 | Bacchi et al. ............. 414/416.03 |
| 6,435,799 | B2 | * | 8/2002 | Goodwin et al. ......... 414/225.01 |
| 6,932,557 | B2 | * | 8/2005 | Downs et al. .................. 414/741 |
| 7,748,760 | B2 | * | 7/2010 | Kushida et al. ............... 294/213 |
| 2001/0001277 | A1 | * | 5/2001 | Goodwin et al. ............. 414/217 |
| 2003/0035711 | A1 | * | 2/2003 | Gilchrist .................... 414/744.5 |

FOREIGN PATENT DOCUMENTS

| JP | 07-078859 | 3/1995 |
|---|---|---|
| JP | 2002-158272 | 5/2002 |

OTHER PUBLICATIONS

International Search Report for corresponding International Application No. PCT/JP2009/052963 dated Apr. 28, 2009.

* cited by examiner

*Primary Examiner* — Scott Lowe
(74) *Attorney, Agent, or Firm* — Renner, Otto, Boisselle & Sklar, LLP

(57) ABSTRACT

A conveyor robot (10) includes a main body (12), a first arm (18), and a second arm (16). The first arm (18) is designed to be reciprocable between a wafer cassette and a position above the main body (12). The first arm (18) is provided with a first hand (182) having a plurality of gripping portions designed to grip a wafer. The second arm (16) is designed to be reciprocable between a position above the main body (12) and a wafer stage. The second arm (16) is provided with a second hand (162) having a plurality of gripping portions designed to grip the wafer from a different angle than do the gripping portions of the first hand (182). The gripping portions of the first hand (182) and those of the second hand (162) are positioned at equal height.

2 Claims, 8 Drawing Sheets

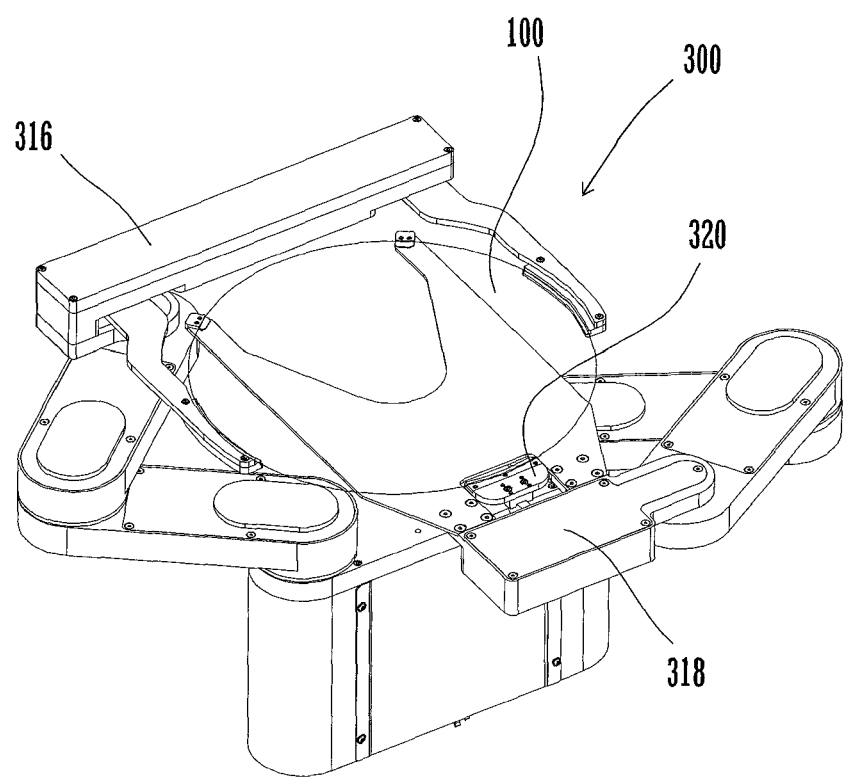

CONVEYOR ROBOT

TECHNICAL FIELD

The present invention relates to a conveyor robot designed to convey a work between a work cassette having a plurality of work storage slots and a work stage forming a front part of a processing apparatus.

BACKGROUND ART

An EFEM (Equipment Front End Module) is a device for passing a wafer between a processing apparatus configured to perform wafer processing and a wafer cassette having a plurality of wafer storage slots under clean conditions. A conveyor robot is provided inside the EFEM to convey the wafer between the wafer cassette and the wafer stage which are located upstream of the processing apparatus.

Such a conveyor robot is required to convey the wafer between the wafer cassette and the wafer stage without damaging the wafer. In recent years, various approaches have been made to increase the wafer conveyance speed. For example, a large number of conventional conveyor robots offer an increased conveyance speed by being provided with a plurality of arms (see Patent Document 1 for example).
Patent Document 1: Japanese Patent Laid-Open Publication No. 2002-158272

DISCLOSURE OF THE INVENTION

Problems to be Solved by the Invention

With increasing number of arms, the wafer replacement speed increases. However, in cases where the wafer cassette and the wafer stage are located on opposite sides across the conveyor robot, the conveyor robot necessarily turns 180 degrees when conveying a wafer from the wafer cassette to the wafer stage. If it is possible to efficiently eliminate such a turning motion of the conveyor robot, an increase in the speed of wafer conveyance between the wafer cassette and the wafer stage, simplification of the structure of the conveyor robot and a reduction in the space to be occupied by the conveyor robot, can be expected.

An object of the present invention is to provide a conveyor robot which is capable of efficiently conveying a work between the work cassette and the work stage without necessitating its turning motion.

Means for Solving the Problems

A conveyor robot according to the present invention is designed to convey a work between a work cassette having a plurality of work storage slots and a work stage forming a front part of a processing apparatus. An example of such a work cassette is a wafer cassette such as an FOUP (Front Opening Unified Pod). An example of such a work stage is a wafer stage such as a wafer passing stage.

The conveyor robot includes a main body, a first arm, and a second arm. The first arm is movably supported on the main body and is designed to be reciprocable between the work cassette and a position above the main body. The first arm is provided with a first hand having a plurality of gripping portions designed to grip the work.

The second arm is movably supported on the main body and is designed to be reciprocable between a position above the main body and the work stage. The second arm is provided with a second hand having a plurality of gripping portions designed to grip the work from a different angle than do the gripping portions of the first hand. One exemplary arrangement for gripping the work from different angles is such that the first hand grips the work from a back-and-forth direction, whereas the second hand grips the work from a transverse direction perpendicular to the back-and-forth direction or an oblique direction relative to the back-and-forth direction. The second hand is positioned higher or lower than the first hand. In an arrangement where the first hand grips the work from below, the second hand is preferably positioned higher than the first hand. On the other hand, in an arrangement where the first hand grips the work from above, the second hand is preferably positioned lower than the first hand.

The gripping portions of the first hand and those of the second hand are positioned at equal height. The "equal height", as used herein, is meant to indicate an arrangement where the gripping portions of the first hand and those of the second hand overlap in a height direction to such an extent as can grip a work placed at a certain height. Therefore, at least one of the upper end and lower end of the gripping portions of the first hand and at least one of the upper end and lower end of the gripping portions of the second hand need not necessarily coincide with each other in height.

With the construction described above, the work can be passed above the main body from the first arm to the second arm. As a result, it becomes possible to convey the work from the work cassette to the work stage and from the work stage to the work cassette by cooperation of the first and second arms without necessitating a turning motion of the robot.

Preferably, that gripping portion of the plurality of gripping portions of the first hand which is designed to grip the work from the work stage side is retractable from a work carrying surface of the first hand in a direction opposite away from the second hand. This arrangement is capable of preventing the gripping portions and the work from interfering with each other without the need to change the height of the second hand after the work has been passed from the first hand to the second hand.

A conventional robot incorporated in an EFEM has been designed with importance attached to versatility in order to accommodate specifications required by individual users. For this reason, the two arms of the robot have been used for the same function and purpose. By contrast, the present invention eliminates the need to turn the robot in conveyance of a work between the work cassette and the work stage by cooperation of the arms sharing a role.

Advantage(s) of the Invention

According to the present invention, it is possible to efficiently convey a work between the work cassette and the work stage without necessitating a turning motion.

BRIEF DESCRIPTION OF THE DRAWINGS

FIG. 7 is a view schematically illustrating a conveyor robot according to another embodiment.

DESCRIPTION OF REFERENCE CHARACTERS

10 . . . conveyor robot
16 . . . second arm
18 . . . first arm
162 . . . second hand
165A, 165B . . . gripping pieces
182 . . . first hand
185A-185C . . . gripping claws

BEST MODE FOR CARRYING OUT THE INVENTION

Figure 1:
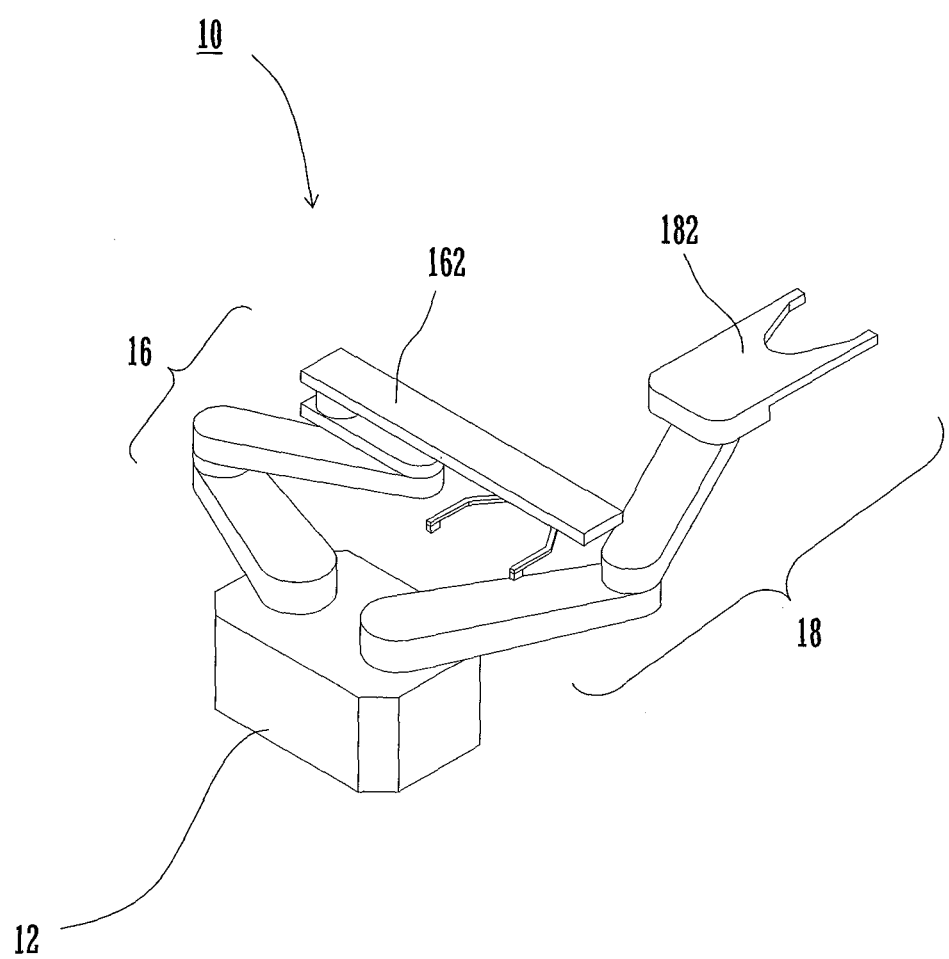
FIG. 1 is a view schematically illustrating a conveyor robot according to an embodiment of the present invention.

FIG. 1 is a view schematically illustrating a conveyor robot according to an embodiment of the present invention. The conveyor robot 10 is disposed inside an EFEM and is designed to convey a wafer (i.e., work) between a wafer cassette, such as a FOUP (Front Opening Unified Pod), and a processing apparatus. In the present embodiment, the conveyor robot 10 is reciprocably placed on a liftable rail. However, the present invention is applicable to cases where the robot is fixedly disposed.

The conveyor robot 10 includes a main body 12, a first arm 18, and a second arm 16. The main body 12 is designed to support the first aim 18 and the second arm 16 for movement.

The first arm 18 is designed to be accessible to the wafer cassette. Specifically, the first arm is designed to be reciprocable at least between the wafer cassette and a position just above the main body 12. The first arm 18 is provided with a first hand 182 for gripping a wafer 100. Normally, the first hand 182 is placed so that its front end faces the wafer cassette.

The second arm 16 is designed to be accessible to a wafer stage. Specifically, the second arm is designed to be reciprocable at least between the wafer stage and a position just above the main body 12. The second arm 16 is provided with a second hand 162 which is capable of gripping a wafer by a different portion of the wafer than does the first hand 182. Normally, the second hand 162 is placed so that its front end faces the wafer stage.

Figure 2A:
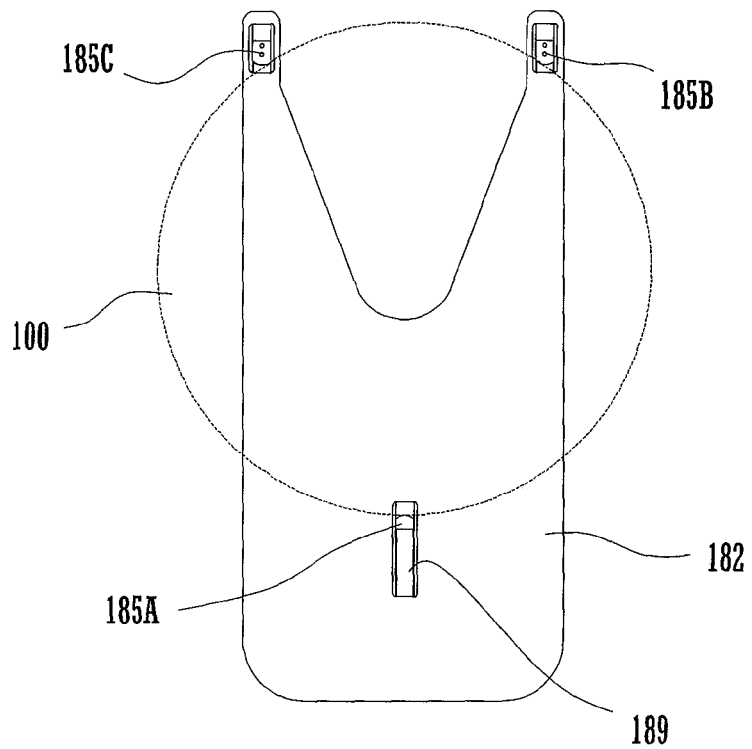
FIGS. 2(A) and 2(B) are views schematically illustrating a first arm.
Figure 2B:
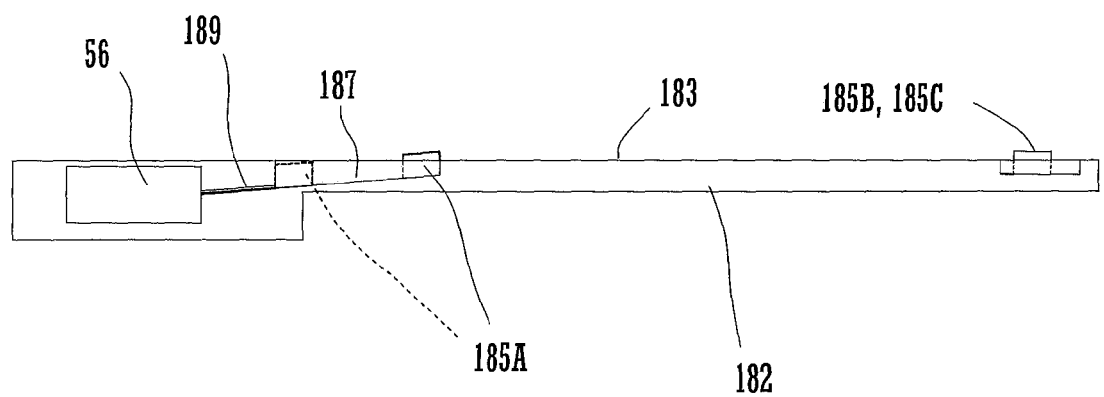

Referring next to FIGS. 2(A) and 2(B), description is made of the first hand 182. The first hand 182 includes a grip drive portion 56, a gripping claw 185A linked to the grip drive portion 56 via a link plate 189, and gripping claws 185B and 185C linked to the grip drive portion 56 via a link plate (not shown). The first grip drive portion 56 is designed to supply the gripping claws 185A to 185C with a necessary driving force. Specifically, the grip drive portion 56 pushes and pulls the link plates to cause the gripping claws 185A to 185C to operate. As a result, the wafer 100 is gripped by or released from the gripping claws 185A to 185C. The gripping claws 185B and 185C need not necessarily be movable, but may be stationarily mounted on the first hand 182. In this case, the above-described link plate linking the grip drive portion 56 to the gripping claws 185B and 185C is unnecessary.

The first hand 182 further includes a recess portion 187 having a sloped bottom surface which lowers as it extends closer to the grip drive portion 56. The purpose of the recess portion 187 is to allow the gripping claw 185A to retract into a position below a wafer carrying surface 183. In the present embodiment, the gripping claw 185A becomes positioned lower than the wafer carrying surface 183 when the gripping claw 185A becomes closest to the grip drive portion 56.

Figure 3:
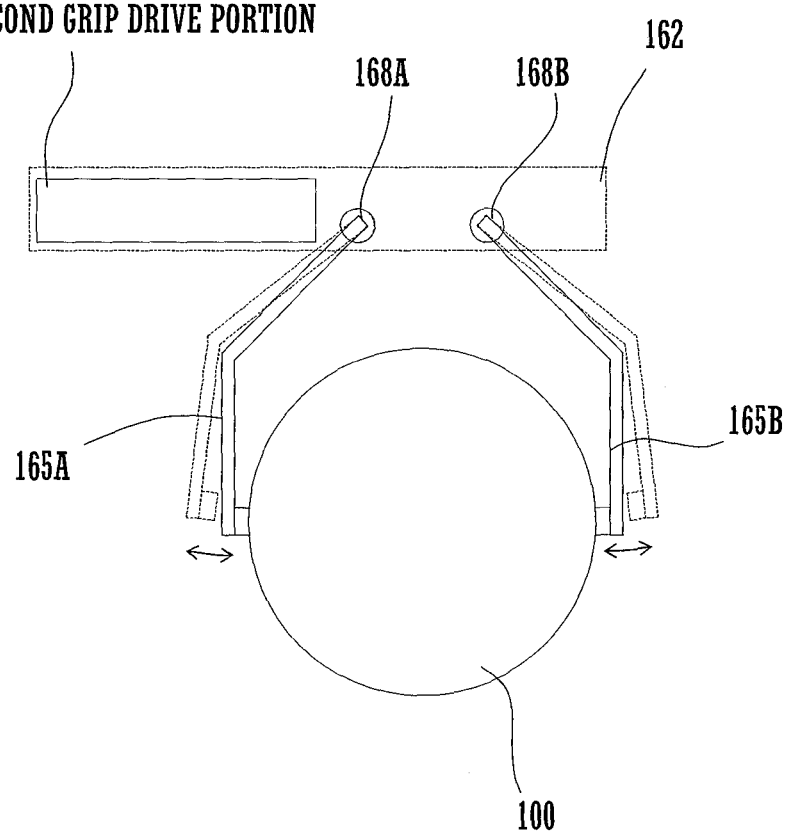
FIG. 3 is a view schematically illustrating a second arm.

Referring next to FIG. 3, description is made of the second hand 162. The second hand 162 includes a pair of gripping pieces 165A and 165B, support portions 168A and 168B supporting the gripping pieces 165A and 165B, respectively, and a second grip drive portion 60. The second grip drive portion 60 is designed to supply the gripping pieces 165A and 165B with a necessary driving force. The support portions 168A and 168B, which are designed to be rotatable, are rotated through a slight angle by the driving force of the second grip drive portion 60. As a result, the wafer 100 is gripped by or released from the gripping pieces 165A and 165B.

The present embodiment is arranged such that the gripping claws 185A to 185C grip the wafer 100 from the back-and-forth direction while the gripping pieces 165A and 165B grip the wafer 100 from a transverse direction. The main reason for the adoption of this arrangement is to pass the wafer 100 from the first hand 182 to the second hand 162 smoothly. This will be described later.

Figure 4:
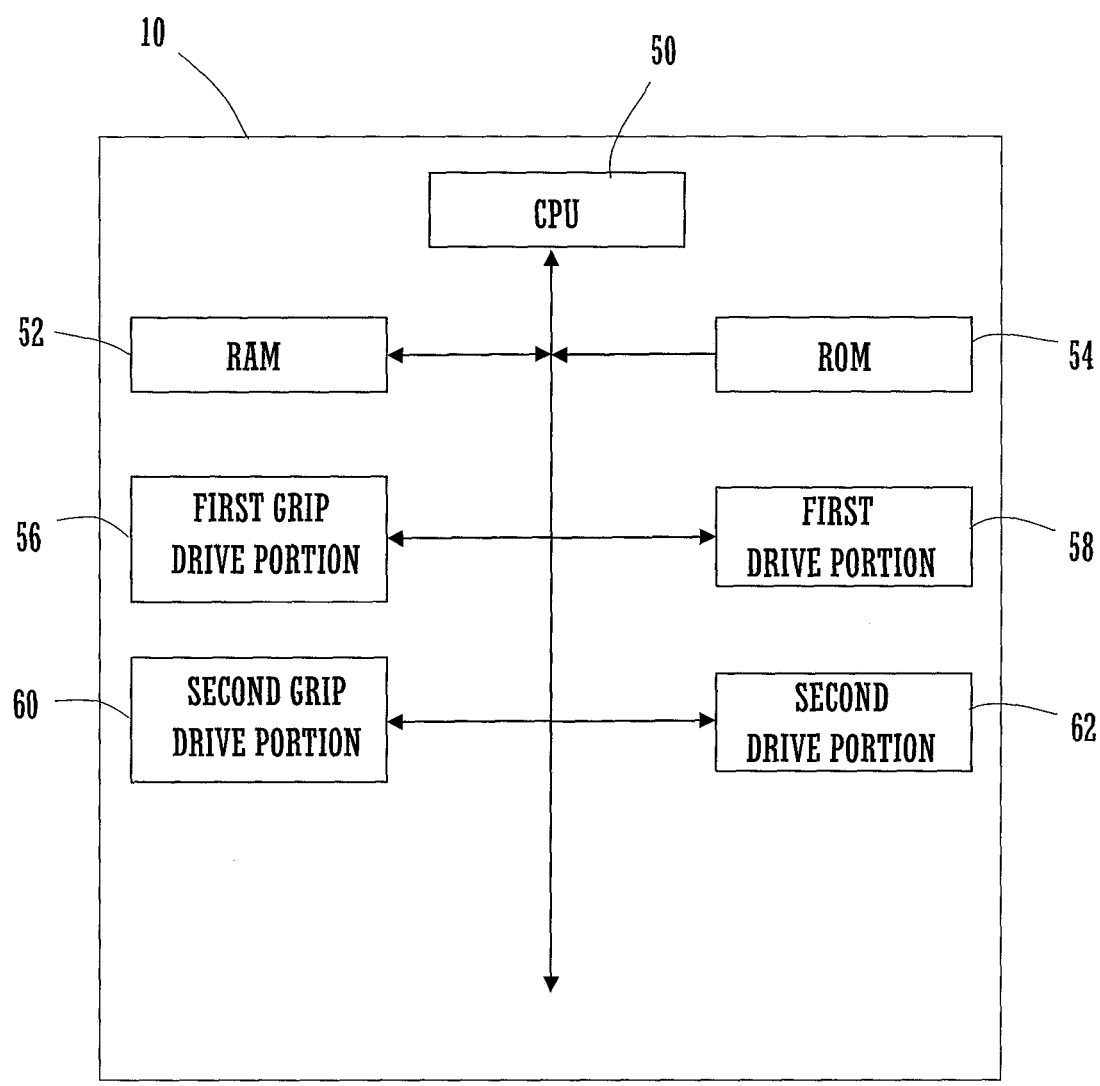
FIG. 4 is a schematic block diagram of a conveyor robot.

FIG. 4 is a schematic block diagram of the conveyor robot 10. As shown in FIG. 4, the conveyor robot 10 includes at least a CPU 50, ROM 54, RAM 52, first drive portion 58, first grip drive portion 56, second drive portion 62, and second grip drive portion 60.

The ROM 54 has stored therein a plurality of programs required for the operation of the CPU 50. The RAM 52, which is a memory device directly accessible to the CPU 50, is used to store data therein temporarily. The first drive portion 58 includes at least one motor and is designed to supply the first arm 18 with a necessary driving force. The second drive portion 62 includes at least one motor and is designed to supply the second arm 16 with a necessary driving force.

Examples of drive mechanisms employed for the first grip drive portion 56 and the second grip drive portion 60 include a drive mechanism utilizing a fluid pressure cylinder, a drive mechanism utilizing an electromagnet, and a drive mechanism utilizing a small sized motor.

The CPU 50 controls different portions of the conveyor robot 10 based on the programs stored in the ROM 54. For example, the CPU 50 controls the operation of removing the wafer 100 from the wafer cassette by the first hand 182, the operation of passing the wafer 100 from the first hand 182 to the second hand 162, and the operation of conveying the wafer 100 to the wafer stage by the second hand 162.

Figure 5A:
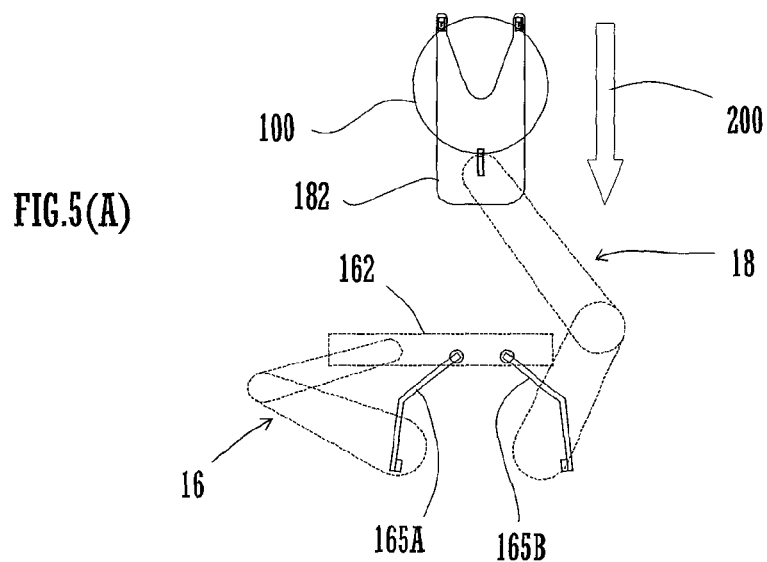
FIGS. 5(A) to 5(C) are views illustrating operations of the first and second arms.

Referring next to FIG. 5, description is made of a procedure by which the wafer 100 is conveyed from the wafer cassette to the wafer stage. In FIG. 5, the wafer cassette is located on the upper side of the drawing and the wafer stage is located on the lower side of the drawing. FIG. 5(A) illustrates a state in which the first arm 18 has removed the wafer 100 from the wafer cassette. From this state the first arm 18 moves toward the wafer stage (in the direction indicated by arrow 200). At that time, the second hand 162 is on standby with its gripping pieces 165A and 165B open at a position above the main body 12.

Figure 5B:
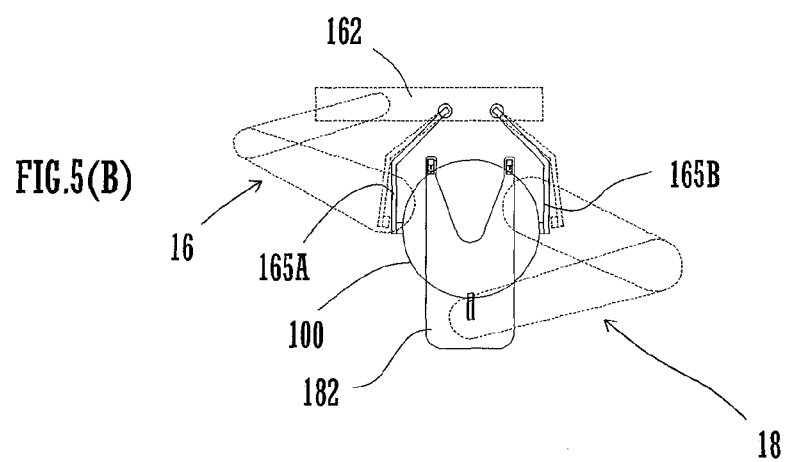

FIG. 5(B) illustrates a state in which the first hand 182 has reached a position just above the main body 12 by passing below the second hand 162. In this state the second hand 162 grips the wafer 100 by closing the gripping pieces 165A and 165B. Simultaneously with or immediately after the gripping of the wafer 100 by the second hand 162, the gripping claws 185A to 185C release the wafer 100 from their gripping.

Figure 5C:
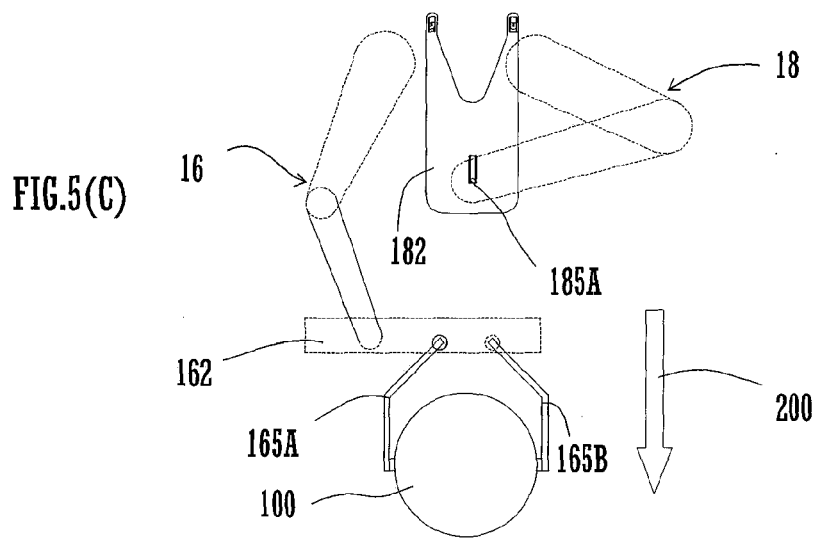
Figure 6:
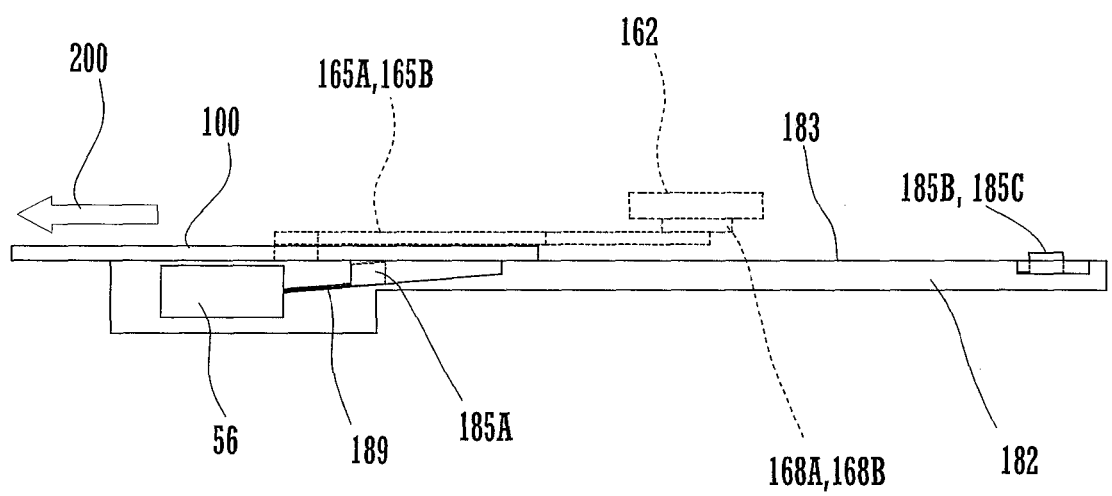
FIG. 6 is a view illustrating the first arm passing a wafer.

Subsequently, the second hand 162 conveys the wafer 100 to the wafer stage as shown in FIG. 5(C). At that time, the gripping claw 185A is in a retracted position lower than the wafer carrying surface 183 as shown in FIG. 6 and hence fails to interfere with the conveyance of the wafer 100. As a result, the wafer 100 can be conveyed with the first arm 18 at a height maintained as it is without the need to move the first arm 18 up and down. When an arrangement is employed in which the first arm 18 and the second arm 16 are capable of moving up and down independently of each other to enable adjustment of their relative heights, it is unnecessary for the gripping claw 185A to retract into the position lower than the wafer carrying surface 183.

It should be noted that in conveying the wafer 100 from the wafer stage to the wafer cassette, the operations are performed following a procedure in reverse of the above-described procedure.

According to the embodiment described above, by designing the arms of the double arm type conveyor robot 10 so that they are exclusively used for the wafer cassette and the wafer stage, respectively, the conveyor robot 10 does not need to perform a turning motion (about the axis). Therefore, it is not necessary for the conveyor robot 10 to incorporate an arrangement for enabling such a turning motion (about the axis) and there is no need to secure a space required for the turning motion (about the axis).

Further, since the second hand 162 designed to be exclusively used for the wafer stage grips the wafer 100 not from the back-and-forth direction but from the transverse direction, the operation on the wafer stage is made efficient. For example, such a procedure becomes possible which includes: conveying the wafer 100 to the wafer stage and placing it thereon; thereafter, gripping a wafer finished with processing placed on another tier with the second hand 162 lifted up only slightly and passing it back to the first hand 182; and storing the wafer into the wafer cassette. This series of operations is impossible for a robot having general-purpose hands each designed to grip a wafer from the back-and-forth direction. Therefore, only the feature that the second hand 162 is exclusively used for the wafer stage can provide such a merit. In short, it is possible to shorten the time required for replacement of works on the wafer stage by using the second hand 162 exclusively for the wafer stage. It is also possible to carry out an alignment process on the wafer stage when an aligner is mounted on the wafer stage.

While the above-described embodiment employs the arrangement in which the gripping claw 185A is retractable into the position lower than the wafer carrying surface 183, the gripping claw 185A is not limited to this arrangement. For example, it is possible to employ an arrangement in which the gripping claw 185A is erectable at selected occasions or an arrangement in which the gripping claw 185A is supported for up-and-down movement so that the gripping claw 185A protrudes upwardly from the wafer carrying surface 183 at selected occasions.

Figure 8A:
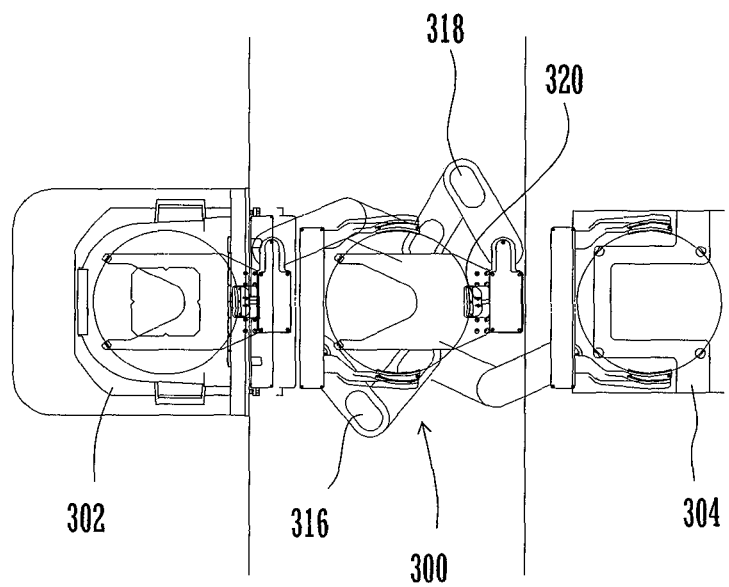
FIGS. 8(A) and 8(B) are views schematically illustrating a conveyor robot according to another embodiment.
Figure 8B:
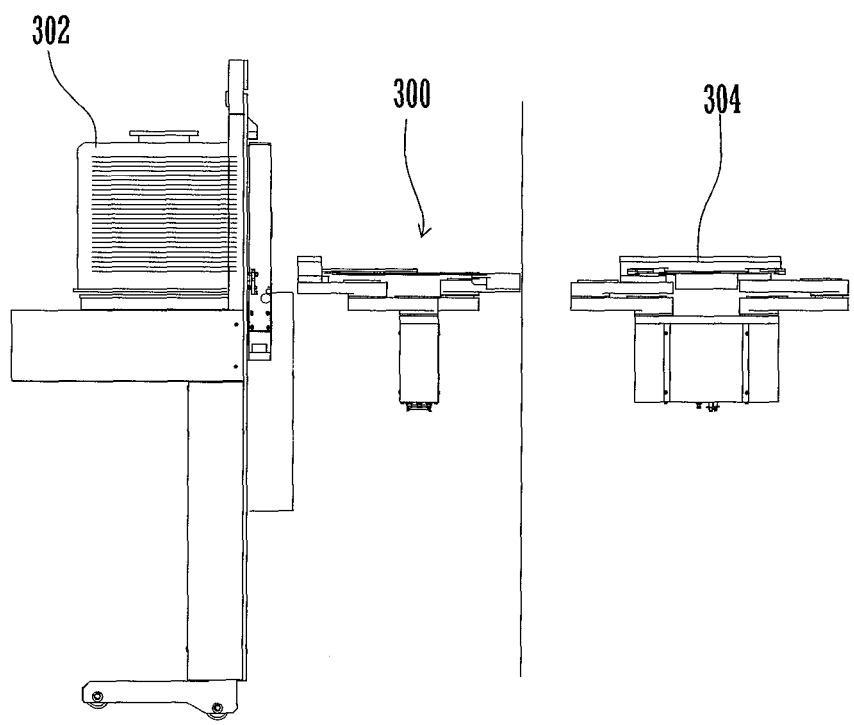

Referring next to FIGS. 7 and 8, schematic description is made of a conveyor robot 300 according to another embodiment of the present invention. FIG. 7 is a perspective view illustrating an outward appearance of the conveyor robot 300. FIGS. 8(A) and 8(B) illustrate a relative positional relationship between the conveyor robot 300, a wafer cassette 302 and a processing apparatus 304 (or a wafer stage).

Though the conveyor robot 300 shown in FIG. 7 is different in outward appearance from the conveyor robot 10 according to the foregoing embodiment, these robots have the same basic structure. Therefore, description of the basic structure of the conveyor robot 300 will be omitted.

Like the conveyor robot 10, the conveyor robot 300 is disposed inside an EFEM and is designed to convey the wafer 100 between the wafer cassette 302 and the processing apparatus 304 (or the wafer stage). The conveyor robot 300 is reciprocably placed on a non-illustrated liftable rail.

The conveyor robot 300 includes a first arm 318 designed to be accessible to the wafer cassette 302, and a second arm 316 designed to be accessible to the processing apparatus 304 (or the wafer stage). As shown in FIG. 8, the structures and operations of the first and second arms 318 and 316 are similar to those of the first and second arms 18 and 16 according to the foregoing embodiment (see FIG. 5) and, therefore, description thereof is omitted. The first arm 318 employs a retractable gripping claw 320 similar to the gripping claw 185A according to the foregoing embodiment.

As described above, each of the conveyor robots 10 and 300 can be appropriately altered in specifications, such as outward form and size, depending on the space provided therefor in the EFEM.

The foregoing embodiments are illustrative in all points and should not be construed to limit the present invention. The scope of the present invention is defined not by the foregoing embodiments but by the following claims. Further, the scope of the present invention is intended to include all modifications within the scopes of the claims and within the meanings and scopes of equivalents.

The invention claimed is:

1. A conveyor robot designed to convey a work between a work cassette having a plurality of work storage slots and a work stage forming a front part of a processing apparatus along a linear conveyance path by two arms each having a hand gripping the work and to pass the work from one hand of the arms to the other hand of the arms during conveying the work, the conveyor robot comprising:
   a main body;
   a first arm movably supported on the main body and designed to be reciprocable between the work cassette and a position above the main body; and
   a second arm movably supported on the main body and designed to be reciprocable between a position above the main body and the work stage,
   the first arm being provided with a first hand having a plurality of gripping claws designed to support the work from below and to be retractable below a work carrying surface,
   the second arm being provided with a second hand having a pair of gripping pieces designed to hold the work at sides of the work, the second hand being positioned higher than the first hand, wherein
   after the gripping claws of the first hand that support the work and the gripping pieces of the second hand being positioned at equal height in passing the work, the pair of the gripping pieces of the second hand are designed to hold the work between the pieces, and the plurality of gripping claws of the first hand are designed to retract below the work carrying surface of the first hand.

2. The conveyor robot according to claim 1, wherein:
   the gripping claws of the first hand are designed to grip the work from opposite sides in a direction parallel with a direction in which the first hand moves; and
   the gripping pieces of the second hand are designed to grip the work from opposite sides in a direction perpendicular to a direction in which the second hand moves.

* * * * *